United States Patent
Trantham

(10) Patent No.: US 10,152,249 B2
(45) Date of Patent: Dec. 11, 2018

(54) DATA MEMORY DEVICE AND CONTROLLER WITH INTERFACE ERROR DETECTION AND HANDLING LOGIC

(71) Applicant: Seagate Technology LLC, Cupertino, CA (US)

(72) Inventor: Jon David Trantham, Chanhassen, MN (US)

(73) Assignee: Seagate Technology LLC, Cupertino, CA (US)

( * ) Notice: Subject to any disclaimer, the term of this patent is extended or adjusted under 35 U.S.C. 154(b) by 10 days.

(21) Appl. No.: 15/272,240

(22) Filed: Sep. 21, 2016

(65) Prior Publication Data

US 2017/0075603 A1    Mar. 16, 2017

Related U.S. Application Data

(63) Continuation of application No. 12/351,283, filed on Jan. 9, 2009, now abandoned.

(51) Int. Cl.
| | |
|---|---|
| G06F 11/00 | (2006.01) |
| G06F 3/06 | (2006.01) |
| G06F 11/10 | (2006.01) |
| G11C 29/52 | (2006.01) |
| H03M 13/09 | (2006.01) |

(52) U.S. Cl.
CPC ............ *G06F 3/0619* (2013.01); *G06F 3/064* (2013.01); *G06F 3/0679* (2013.01); *G06F 11/1004* (2013.01); *G06F 11/1008* (2013.01); *G06F 11/1068* (2013.01); *G11C 29/52* (2013.01); *H03M 13/09* (2013.01)

(58) Field of Classification Search
None
See application file for complete search history.

(56) References Cited

U.S. PATENT DOCUMENTS

| | | | | |
|---|---|---|---|---|
| 6,459,635 | B1 * | 10/2002 | Mullarkey | G11C 7/22 365/201 |
| 8,775,730 | B2 * | 7/2014 | Inoue | G06F 3/061 711/114 |
| 2006/0149890 | A1 * | 7/2006 | Gorobets | G06F 12/0246 711/103 |
| 2006/0250374 | A1 * | 11/2006 | Morita | G06F 3/0488 345/173 |
| 2008/0086631 | A1 * | 4/2008 | Chow | G06F 8/654 713/2 |
| 2009/0019250 | A1 * | 1/2009 | Rofougaran | G06F 12/0623 711/170 |

* cited by examiner

*Primary Examiner* — Mujtaba M Chaudry
(74) *Attorney, Agent, or Firm* — Cesari & Reed LLP; Kirk A. Cesari; Christian W. Best

(57) ABSTRACT

The present disclosure provides a data storage system including a data memory device and controller having interface error detection and handling logic. In one example, a solid-state data memory device is provided and includes a semiconductor package. A memory array is provided in the semiconductor package and an interface is provided that is communicatively couplable to a device bus for receiving data to be stored to the memory array. An error detection component is provided in the semiconductor package and is associated with the interface of the solid-state data memory device. The error detection component is configured to detect errors occurring on data received at the interface prior to the data being stored to the memory array.

25 Claims, 8 Drawing Sheets

DATA MEMORY DEVICE AND CONTROLLER WITH INTERFACE ERROR DETECTION AND HANDLING LOGIC

CROSS REFERENCE TO RELATED APPLICATIONS

The present application claims priority to and is a continuation of U.S. patent application, application Ser. No. 14/175,495, filed Jan. 9, 2009, entitled "DATA MEMORY DEVICE AND CONTROLLER WITH INTERFACE ERROR DETECTION AND HANDLING LOGIC," the contents of which are hereby incorporated by reference in its entirety.

BACKGROUND

The present disclosure relates generally to data storage systems, and more specifically, but not by limitation, to a data memory and controlling device having interface error detection and handling logic.

Many data memory devices support interfaces through which commands and data are sent from a controller device. The memory device performs an operation based upon the command sent. For example, most NAND flash data memory devices support a variety of commands related to the storage of data within the device. Over an interface, data can be erased, programmed, read, and/or copied by sending various commands to the NAND flash from a controlling device (e.g., a flash controller). Unfortunately, the commands, data, parameters, and/or status information, for example, associated with these operations can contain errors.

The discussion above is merely provided for general background information and is not intended to be used as an aid in determining the scope of the claimed subject matter.

SUMMARY

In one exemplary embodiment, a solid-state data memory device is provided and includes a semiconductor package. A memory array is provided in the semiconductor package and an interface is provided that is communicatively couplable to a device bus for receiving data to be stored to the memory array. An error detection component is provided in the semiconductor package and is associated with the interface of the solid-state data memory device. The error detection component is configured to detect errors occurring on data received at the interface prior to the data being stored to the memory array.

In another exemplary embodiment, a controller in a data storage system is provided. The controller includes at least one interface for communicating data with a plurality of data memory devices and a database containing a plurality of identifiers. At least one identifier is associated with and uniquely identifies each of the plurality of data memory devices. A component is provided that is configured to generate, for a transmission of data between the controller and a data memory device, an error control code based on the data and the at least one identifier associated with the data memory device.

In another exemplary embodiment, a data storage system is provided. The system includes a plurality of data memory devices each comprising a memory element for storing data. The system also includes a controller having at least one interface for communicating data with the plurality of data memory devices. The controller is configured to provide data to be stored to a data memory device along a write path between an interface of the controller and the memory element of the data memory device. The system also includes an error detection component associated with the data memory device and configured to detect errors on data transmitted between the controller and the data memory device. The error detection component is provided in the write path and is configured to determine a number of errors in the data prior to the data being stored to the memory element of the data memory device.

These and various other features and advantages will be apparent from a reading of the following Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the background.

DETAILED DESCRIPTION

The present disclosure provides a data storage system including one or more data memory devices and one or more data memory device controllers having interface error detection and handling logic. A data memory device includes a device designed to store digital information. Examples of data memory devices include volatile and non-volatile memory. Generally, volatile memory requires power to maintain the stored information whereas non-volatile memory can retain stored information even when not powered. Further, examples of data memory devices include solid-state semiconductor-based memory (which typically do not have moving parts) and non-solid-state memory.

Particular examples of solid-state semiconductor-based data memory devices include, but are not limited to, NAND flash, NOR flash, EEPROM, SRAM, DRAM, MRAM, spin-torque RAM, and phase change memory. It is noted that although various embodiments are described herein in the context of solid-state semiconductor-based memory devices, in particular flash memory devices, the concepts described herein can be applied to other types of data memory devices. This can include non-solid state memory as well as other types of solid-state memory. For example, embodiments described herein can also be utilized in data storage systems that include hard discs, floppy discs, magnetic discs, optical discs, magnetic tapes, random access memory (RAM), dynamic random access memory (DRAM), static random access memory (SRAM), read-only memory (ROM), and/or electrically erasable programmable read-only memory (EEPROM), to name a few.

Figure 1:
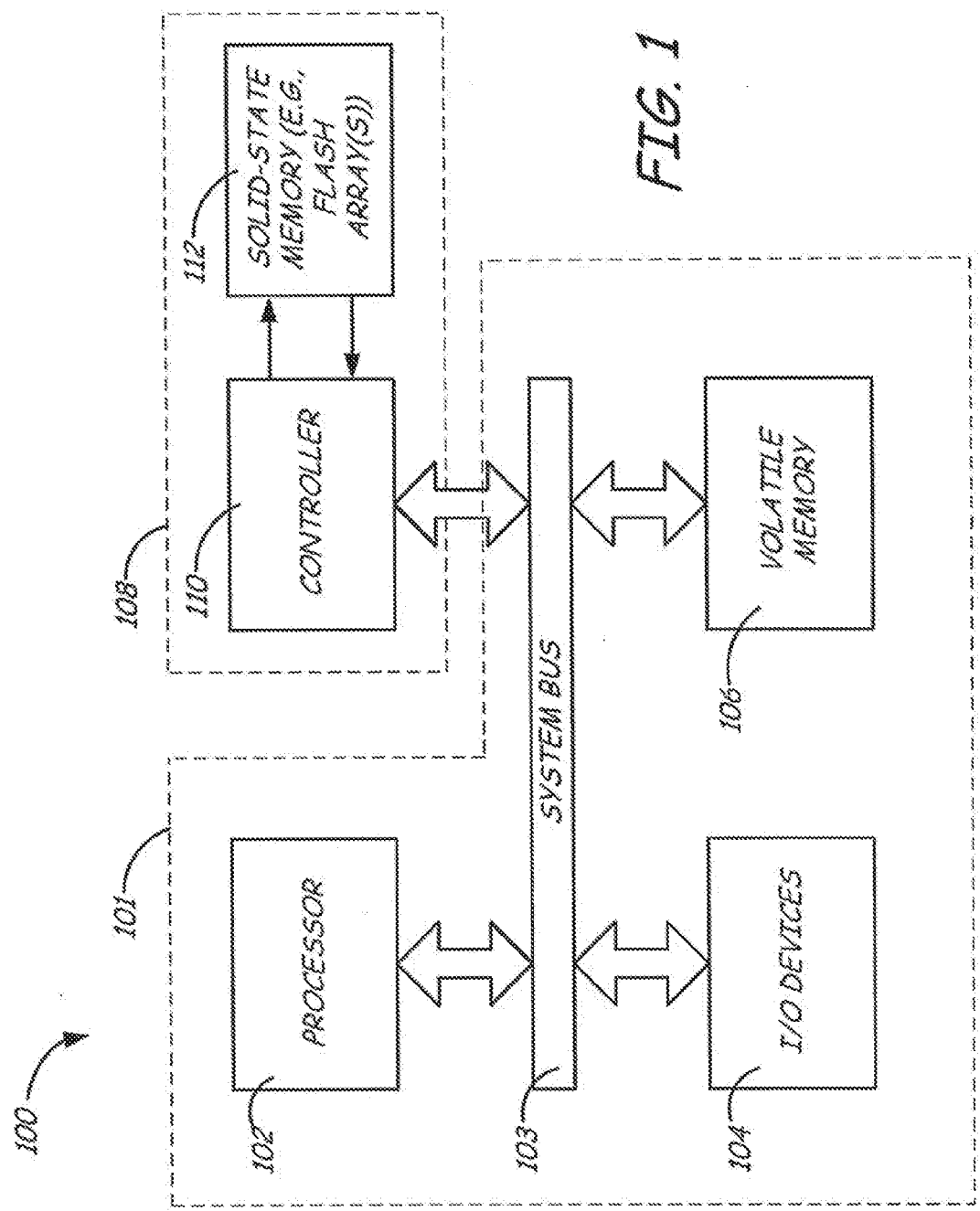
FIG. 1 is a schematic diagram of an exemplary system for processing and storing data.

FIG. 1 is a schematic diagram of an exemplary data computing system 100. As illustrated, a host system 101 includes a processor 102 connected to a system bus 103 which also can be connected to input/output (I/O) devices 104, such as a keyboard, monitor, modem, storage device, or pointing device. The system bus 103 is also coupled to a memory 106, which can include a random access volatile memory, such as dynamic random access memory (DRAM). The system bus 103 is also coupled to a data storage system 108. In the illustrated embodiment, the data storage system 108 comprises a non-volatile semi-conductor-based data memory device. For example, data storage system 108 can comprise a solid-state drive. In other embodiments, the data storage system 108 can include volatile and/or non-solid-state memory. For example, data storage system 108 can comprise a disc drive and/or a "hybrid" drive including solid-state components and hard disc components.

Data storage system 108 can include a controller 110, which can be coupled to the processor 102 via a connection through the system bus 103. It is noted that in some systems this connection is made through one or more intermediary devices, such as a host bus adapter or a bridge. As illustrated, the memory device 108 includes solid-state memory 112, in particular flash memory that contains one or more arrays of flash memory cells. The arrays of memory cells can include one or more integrated circuit memory chips.

During operation, the processor 102 can send a command and data to the data storage device 108 to retrieve or store data. The controller 110 can receive the command and data from the processor 102 and then determine when to store or retrieve data from the solid-state memory 112.

Figure 2:
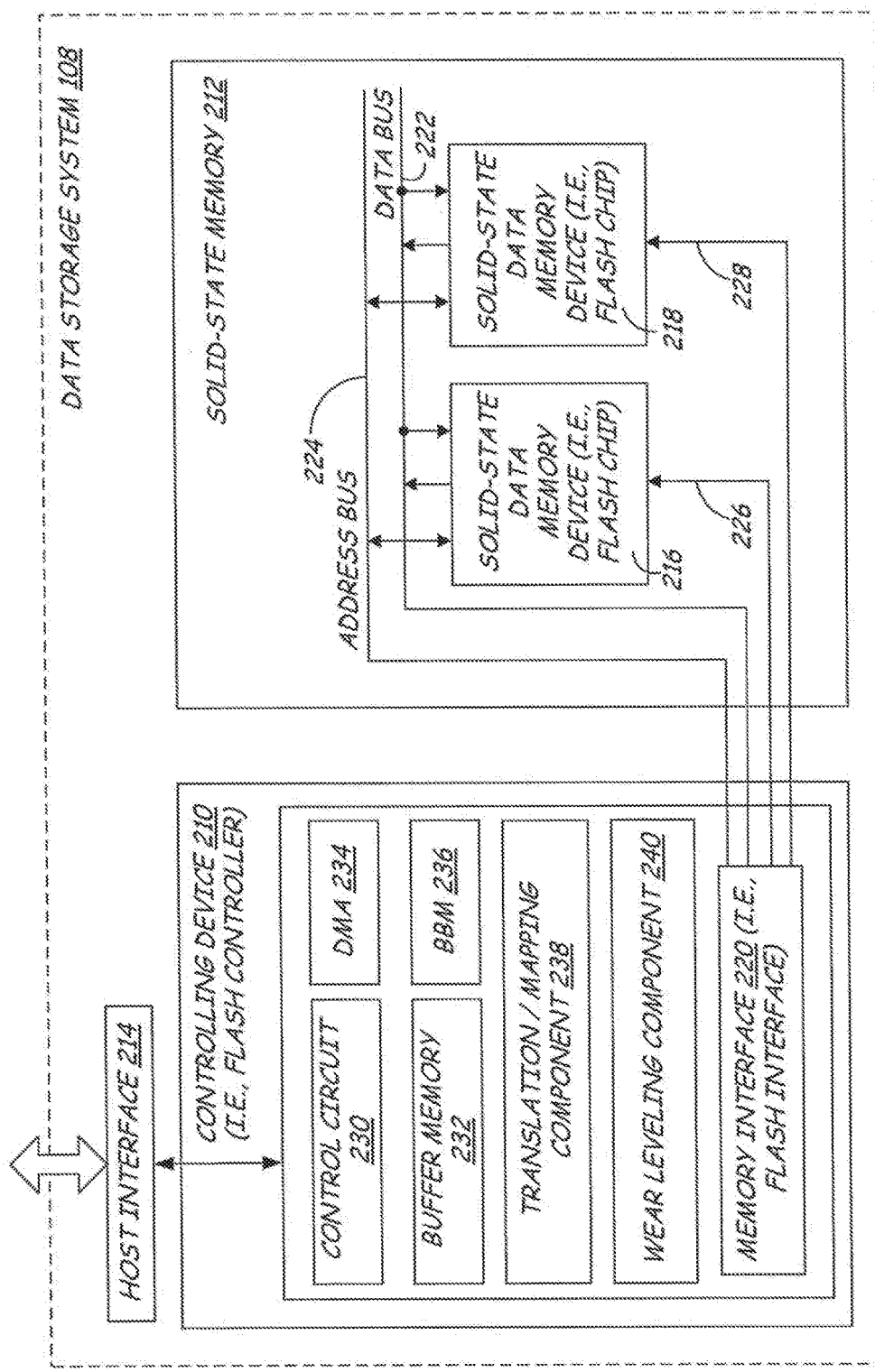
FIG. 2 is a schematic diagram of one embodiment of a data storage system.

FIG. 2 is a schematic diagram illustrating one embodiment of data storage system 108. Data storage system 108 includes a controlling device 210 (illustratively a flash controller) that is configured to store information to and retrieve information from solid-state memory 212. Solid-state memory 212 includes one or more solid-state data memory devices 216 and 218 (illustratively flash chips) including memory arrays. In one embodiment, a flash chip comprises a semiconductor package that includes one or more semiconductor dice provided in a housing. The semiconductor package includes an interface for communicating information with memory interface 220, control circuitry, and a storage area having a particular capacity based on the design of the chip. For example, in one embodiment the storage area of each flash memory chip 216 and 218 is capable of storing 1 gigabyte (GB) of data. In another embodiment, each flash chip 216 and 218 can store more than or less than 1 GB (for example, 128 MB, 256 MB, 512 MB, 2 GB, 4 GB, 8 GB, 16 GB, etc.).

Controller 210 includes a memory interface 220 (illustratively a flash memory interface) that is coupled to the data memory devices 216 and 218 via one or more device busses for communicating commands and/or data. For example, memory interface 220 can be coupled to the data memory devices via a data bus 222, an address bus 224, and a chip select signals 226 and 228. While FIG. 2 shows a separate data and address bus, it is noted that the attachment methodology between the controlling device and data memory device can be of a variety of different forms; for example, multiplexed address and data bus, combined I/O busses, and a variety of serial communication interfaces, to name a few. Further, while memory 212 is illustrated as including two flash chips 216 and 218, it is noted that memory 212 can include any number and type of memory device(s). This includes multiple logical storage units within a single die or package. For example, in one embodiment more flash chips can be coupled to the data bus 222, the address bus 224, and to chip select lines 226 and 228 than are shown in FIG. 2. Furthermore, the system can contain multiple attachment busses or other bus topologies than are shown in FIG. 2.

The controller 210 is communicatively coupled to a host, such as host system 101 illustrated in FIG. 1, via a host interface 214 that can receive and send commands, status information, and data to the host. The host interface 214 can pass commands to a control circuit 230 of controller 210 for processing and also store the received data in a buffer memory 232. The buffer memory 232 provides the received data to the memory interface 220.

The memory interface 220 can receive data from the buffer memory 232 to be written to one or more of the data memory devices 216 or 218 and receive address bits from the control circuit 230. The memory interface 220 can assert corresponding data and address bits with appropriate timing and format to a selected flash chip. Memory interface 220 can also read previously stored data from any selected sector of flash chips 216 and/or 218.

The control circuit 230 can also be coupled to a direct memory address (DMA) controller 234 to allow the control circuit 230 to access the memory arrays of flash chips 216 and 218 for reading and writing data.

The controller 210 can also include a bad block management (BBM) component 236 that maintains a record of storage locations (e.g., blocks, pages, etc.) within solid-state memory 212 that contain one or more invalid bits whose reliability cannot be guaranteed. "Bad" blocks can be present when the memory to device is manufactured or can develop during the lifetime of the memory device. For example, BBM component 236 can create a bad block table by reading areas in the data memory devices 216 and 218. The table is stored, for example, in a spare area of the solid-state memory 212. The blocks that are contained in the bad block table are not addressable. As such, if the controller 210 addresses one of the bad blocks identified by the bad block table, the BBM component 236 redirects the operation and re-maps the block address by allocating a new or spare block in solid-state memory 212.

In the flash memory example of FIG. 2, when a logical sector of data (i.e., a portion of data from host system 101 having an associated logical block address (LBA)) is to be written to memory 212, flash controller 210 identifies the physical address of the physical block to which the data will be written. The logical block address (LBA) is the address that the host system uses to read or write a block of data to data storage system 108. The physical block address is the fixed, physical address of a block in the storage component. The controller 210 can store a mapping of the logical addresses to the corresponding physical addresses in a translation/mapping component 238. The mapping information stored in component 238 is utilized for subsequent data access operations to locate requested data in the memory 212.

Further, some types of data memory devices, such as flash chips 216 and 218, can include memory locations that are susceptible to degradation. For example, typical flash memory devices are limited by a maximum number of write, read and/or erase cycles that the device can perform. In accordance with one embodiment, controller 210 can also include a wear leveling component 240 that is configured to distribute write, and/or read, and/or erase cycles across the storage locations of the memory devices. In this manner, the data storage system 108 includes wear leveling to distribute data operations across storage locations in the memory 212 to reduce the possibility that individual storage locations will prematurely fail due to excessive write, and/or read, and/or erase cycles.

Data memory devices 216 and 218 support commanded operations which are generally accomplished by sending a command and associated parameters to the data memory devices 216 and 218 and then transferring data when appropriate based on behavioral rules defined in an interface or device specification. After a command has been sent, the controlling device 210 can also request and retrieve status information from the memory devices 216 and 218 over the interface. For example, the status information typically indicates whether the command has completed and if so, an indication of whether it has completed successfully. The controlling device 210 uses the status information to determine whether or not the operation was successful.

As mentioned, data are transferred in some of these commanded operations. In some cases, the data are transferred over the data bus 222 and/or address bus 224 between the memory devices 216 and 218 and controlling device 210. However, in some cases a data transfer is contained entirely within the memory device(s) 216 and/or 218 where no data are transferred with the controlling device 210. For example, it is possible in some memory devices to copy a block of data from one storage location within the device to another location within the device.

The information transferred between the controlling device 210 and one or more of the data memory devices 216 and 218 can include, but is not limited to, user data, address information, status information, command information, and/or associated parameters. Further, the information can be transferred in a single operation or can be transferred across multiple operations. In one example, a command and user data to be written to a data memory device are transferred at the same time. For instance, the information can comprise a block of data having a command portion, and address portion, and a payload portion including user data to be stored to a data storage device. In another example, a command and associated user data are transferred at different times.

In some instances, the information communicated to and/or from the data memory devices 216 and 218 can contain errors. These errors can occur for any of a variety of reasons. For example, errors can develop in the data before the data are transmitted from the controlling device 210, over data bus 222 before the data are received at a memory device, and/or after the data is received at the data memory device, to name a few. For instance, errors can occur during the transmission of the information due to electrical noise or electrical connection faults, such as short or open circuit connections. Further, errors can occur immediately when data are stored, for example due to a defective storage cell. Further yet, errors can occur in the stored data over the passage of time, for example as a result of the electrical charge used to represent bits of data degrading over time. Errors can occur in the controlling device 210 as well, for instance due to errors caused by radioactive decay resulting in memory and/or logic corruption.

In accordance with one embodiment, the interface of a data memory device (such as data memory devices 216 and/or 218) includes error detection and handling components having logic, which can improve the command and data integrity of the data storage system. In one example, the interface of the data memory device includes error detection and handling logic for performing verification of transmitted information (e.g., commands, parameters, status information, and/or user data, etc.) to detect and handle errors in the information prior to storing data in the data storage device. In this embodiment, the logic of the interface in the data memory device does not require a storage operation to perform error detection and handling.

Figure 3:
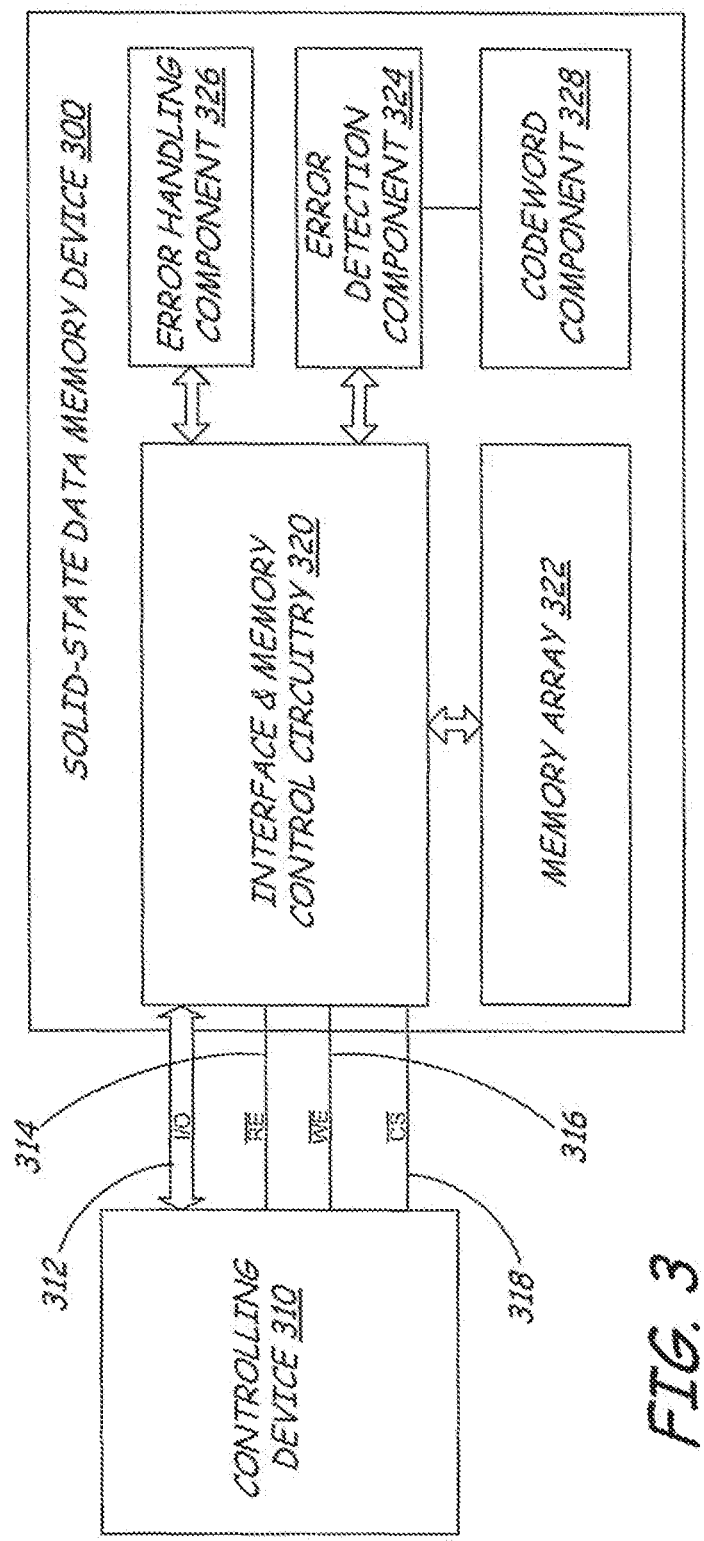
FIG. 3 is a schematic diagram of a solid-state data memory device and controlling device, under one embodiment.

FIG. 3 is a schematic diagram of a solid-state data memory device (such as data memory devices 216 and/or 218) that includes error detection and handling logic that can provide command and/or data integrity, for example. In the embodiment illustrated in FIG. 3, data memory device 300 comprises a semiconductor package having one or more semiconductor dice (e.g., flash dice, etc.) provided in a housing. In one embodiment, one or more chips (e.g., flash chips, etc.) are provided in the housing having an overall size that is less than approximately 50 mm by 50 mm. In one embodiment, the housing has an overall size that is approximately 20 mm by 15 mm. In yet another embodiment, components of device 300 are provided in a housing with an overall size that is less than approximately 1 inch by 1 inch. In another embodiment, the housing can have an overall size that is greater than 1 inch by 1 inch.

In one particular example a semiconductor package includes a plastic ball-grid array (BGA). In another embodiment, a semiconductor package includes a chip-on-board (COB) wherein one or more semiconductor dice are directly affixed to a printed circuit board and typically covered with a protective coating. In another embodiment, a semiconductor package includes a thin, small-outline package (TSOP). In another embodiment, a semiconductor package includes a land grid array (LGA).

Further, components of device 300 can be provided on a single die or a plurality of dice. For example, one or more of blocks 320, 322, 324, 326, and 328 (described below) can be provided on the same die in a semiconductor package. In another example, one or more of blocks 320, 322, 324, 326, and 328 can be provided on separate die.

Data memory device 300 is coupled to a controlling device 310 through one or more device busses. In one embodiment, device 300 comprises a package having multiple input/output (I/O) pins for communicatively coupling the device 300 to the one or more device busses. The multiple I/O pins enable the interface 320 of device 300 to communicate with the controlling device 300 for receiving input command, address, and data, and for transmitting output data.

For example, an input/output channel 312 is provided for communicating data, commands, address information, and/or any associated parameters, for example. In accordance with one embodiment, commands and data are transmitted to interface 320 over a common communication bus.

Further, the package of device 300 can include a read enable pin providing a read enable signal 314 to control reads to the I/O pins and a write enable pin providing a write enable signal 316 to control writes to the I/O pins. Further, the package of device 300 can include a chip enable pin for providing a chip enable signal 318 to enable the data memory device 300 for operation. Further yet, the package can include, for example, a write protect pin to provide write and erase protection, a ready/busy pin to indicate a status of the device as ready or busy, a power supply pin, and a ground pin, to name a few.

As illustrated, data memory device 300 includes interface and memory control circuitry 320 configured to receive and transmit information (e.g., user data, commands, instructions, status information, etc.) with controlling device 310. For instance, block 320 receives data from controlling device 310 and stores the data to a memory array 322. In another instance, block 320 retrieves data from memory array 322 and transmits the retrieved data to the controlling device 310 based on a command received from the controlling device 310. The memory array 322 comprises multiple memory cells that can each store at least one bit of information. For example, the multiple memory cells can comprise single level cells and/or multiple level cells (MLC) that can store more than one bit of information per cell. In one instance, the memory cells comprise one or more floating-gate transistors. Further, it is noted that in one example the memory array 322 can be implemented on a signal chip and/or a signal die. In one example, the memory array 322 can comprise multiple chips or dies.

In one embodiment, the interface and memory control circuitry 320 also includes an error detection component 324 and an error handling component 326. The error detection component 324 includes logic and/or software or firmware to for detecting and/or correcting errors in data received at the interface 320. For example, the data received at the interface 320 from controlling device 310 can include one or more error control codes. Error control codes include codes that can be utilized for the detection (e.g., error detection codes (EDC)) and/or correction (e.g., error correction codes (ECC)) of errors occurring in data. In accordance with one embodiment, error detection component 324 includes logic that is utilized to detect errors within both data and commands that are received at interface 320, for example from controlling device 310 over a common communication bus.

In one embodiment, an error control code comprises an error detection code generated using cyclical redundancy code (CRC) codeword generation logic. Other codes and coding techniques can be used in other examples. In this embodiment, a codeword component 328 can be configured to analyze the error detection code to determine if the received data contains errors. Further, the error detection component 324 can also include codeword generation logic for generating and appending error detection codewords, for example using CRC logic, for data that is transmitted by the data memory device 300. In one embodiment, the controlling device 310 includes corresponding CRC logic for data transmitted over data channel 312.

Error handling component 326 includes logic for processing data and/or performing commands in the event that error detection component 324 detects a threshold number of errors (e.g., one or more errors) in the data. For example, error handling component 326 can be configured to initiate a retry and/or perform error correction algorithms on the data to correct the errors. Moreover, error handling component 326 can be configured to provide a status (e.g., "retry command", "command successful", "command failed", to name a few) to controlling device 310.

It is noted that data memory devices can be produced in packages containing multiple dice, or multiple logical devices on a single die. Concepts described herein are described in the context of a single logical data memory device. For instance, in one embodiment of FIG. 3 the solid-state data memory device 300 comprises a device that consists essentially of a single semiconductor chip, such as a flash memory chip. In this manner, the illustrated components of solid-state data memory device 300 can be provided on a single logical data memory device (i.e., a single piece of silicon, a single chip). However, it is noted that the concepts described herein can be applied to other configuration containing multiple devices. For example, memory device 300 can be provided on multiple chips. In another example, multiple memory devices can be provided on a single chip.

Figure 4:
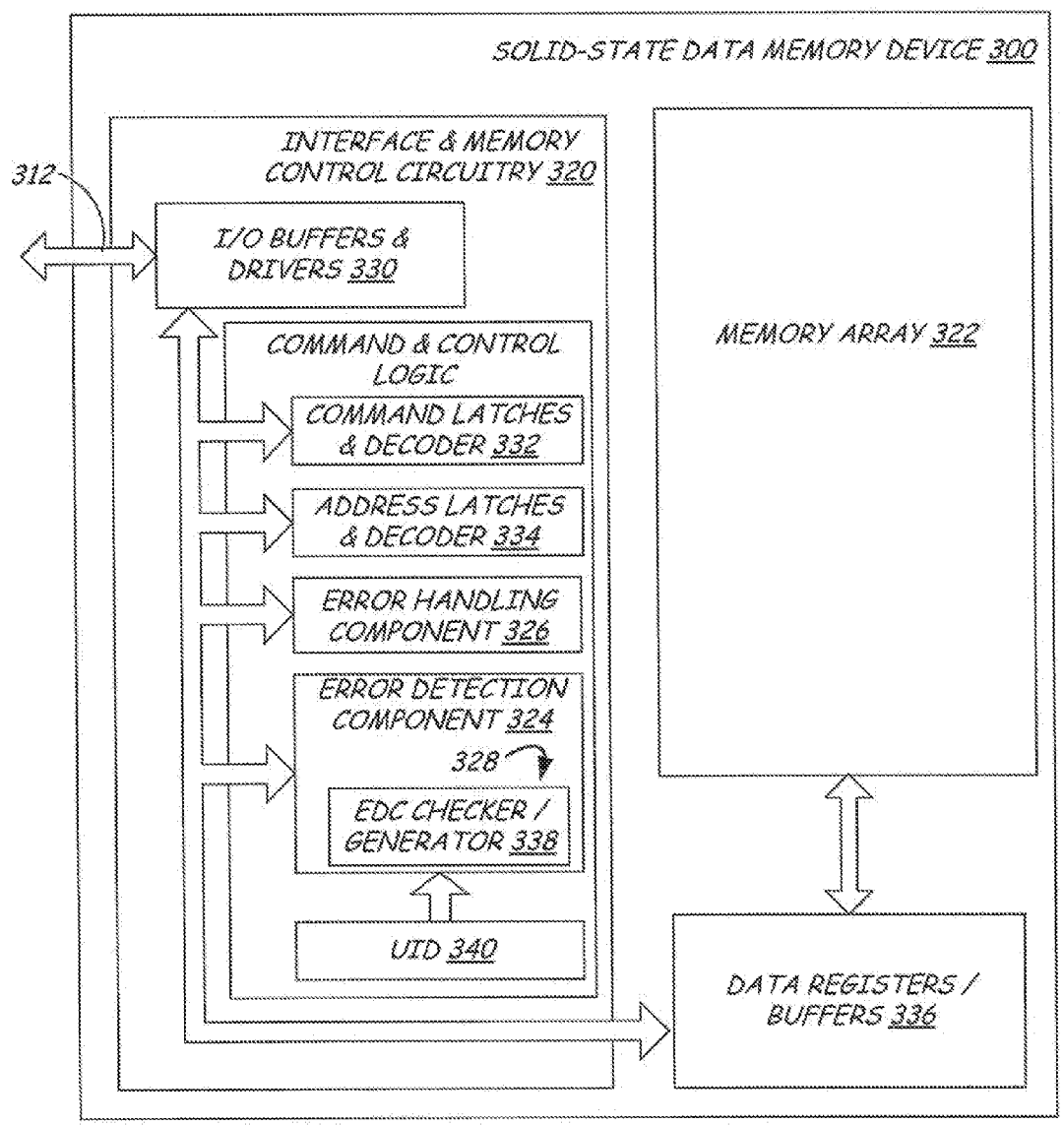
FIG. 4 is a schematic diagram of a solid-state data memory device, under one embodiment.

FIG. 4 illustrates one embodiment of data memory device 300. As shown in FIG. 4, interface and memory control circuitry 320 includes input/output (I/O) buffers and drivers 330 for communicating with controlling device 310 over channel 312. Command and control logic can include command latches and decoder 332 and address latches and decoder 334. The memory control circuitry utilizes blocks 332 and 334 to store and retrieve data from memory array 322 using data registers and buffers 336.

The interface 320 of data memory device 300 includes the error detection component 324, which includes codeword component 328. In one embodiment, the error detection component 324 is provided along a write path such that data is analyzed and errors detected before the data is stored to the memory array 322. For instance, with reference to FIG. 3, data is provided from controlling device 310 over channel 312. The data received by interface 320 and provided along the write path for storage to memory array 322. Prior to storage to the memory array 322, functions of error detection component 324 are implemented to check for and/or correct errors in the data. After the error(s) are checked and/or corrected, the data is provided along the write path to the memory array 322 for storage thereto.

As illustrated, codeword component 328 comprises an error detection codeword (EDC) checker/generator 338. Generally, the EDC checker/generator 338 is configured to operate on error detection codewords to identify errors in transmitted and/or received data. Some examples of error detection and/or correction codes are disclosed in Moon, *Error Correction Coding—Mathematical Methods and Algorithms*, Wiley-Interscience (2005). However, it is noted that these are examples of error detection and/or correction codes that can be utilized and is not intended to limit the scope of the concepts described herein.

In the illustrated embodiment, information received over the interface 320 is appended with error detection codewords generated by the device that transmitted the data, for example, using cyclical redundancy code (CRC) logic generated based on the information. For instance, the interface 320 of device 300 and the controlling device (i.e., device 310) can contain corresponding CRC logic. The CRC logic is designed such that any corrupted bits in a transfer of data over the channel 312 will likely be detected by the CRC logic. Alternatively, or in addition, the error detection codewords can be generated using, for example, check bits, parity bits, check sums, longitudinal redundancy checks, hash functions, polarity schemes, turbo codes, Hamming codes, and Reed-Solomon error correction codes, to name a few.

Component 324 is configured to receive the data and the appended error detection codeword and determine if the data contains a number of errors. For example, block 338 is configured analyze both the data and the appended codeword (for example, using CRC logic) to determine if the received data has a number of errors above a threshold. In another example, block 338 is configured to generate its own codeword based on the received data. For instance, block 338 uses CRC logic to generate a second codeword as a function of the received data. Block 324 then compares the second codeword with the first-mentioned codeword (the codeword that was appended to the received data). If the comparison fails (i.e., the codewords do not match or otherwise indicate an error), the component 324 determines that the received data contains a number of errors. Based on this determination by component 324, error handling component 326 can initiate a data retry, return status information, and/or perform error correction, for example utilizing the error detection codeword.

Block 338 is also configured to generate error detection codewords to be appended to data sent from data memory device 300 over channel 312, for example to controlling device 310. The error detection codeword generator can be the same as, or similar to, the error detection codeword checker described above.

In accordance with one embodiment, data memory device 300 includes a unique identifier 340 that is associated with and stored in the device 300. In one example, the identifier 340 is a globally unique identifier such that data memory device 300 is uniquely identified from all other data memory devices that are in communication with the controlling device (e.g., controlling device 310 illustrated in FIG. 3).

In one embodiment, the unique identifier 340 is provided as a seed to the EDC checker/generator 338 for initializing the codeword logic. In one example, the unique identifier is convolved with the EDC codeword generated from the data. For example, in a CRC-based EDC the unique identifier number can be used to initialize linear feedback shift registers of a circuitry-based CRC implementation and/or the codeword can be used to initialize the corresponding state variable of a software-based CRC implementation. Initialization of the EDC checker/generator 338 can be performed in response to a setup command sent from the controlling device and/or in response to data received from the to controlling device.

In one embodiment, the controlling device includes copies of the unique identifier 340 for all memory devices it controls in the system. The controlling device selects the identifier corresponding to the target memory device, and that identifier is used to initialize corresponding codeword logic in the controlling device. To illustrate, in the example of FIG. 4 the error detection component 324 includes cyclical redundancy code (CRC) logic that is initialized with the identifier 340. The controlling device initializes (seeds) corresponding CRC hardware in the controlling device using the copy of the unique identifier 340 and generates a codeword based on the data to be transferred. The codeword is appended to the data that is transferred to the data memory device 300. In one exemplary embodiment, the error detection codeword is generated by convoluting the unique identifier with a cyclical redundancy code that is generated on the data to be transmitted. In one example, the convolution comprises combining a unique identifier code (or signal) and the cyclical redundancy code to generate a third code (i.e., the error detection codeword). In one embodiment, the error detection codeword is different than, but is related to, the unique identifier and cyclical redundancy code such that knowledge of the unique identifier is required by a device (e.g., memory device 300) to properly obtain and/or use the cyclical redundancy code for received data.

Further, it is noted that any suitable function, algorithm, etc., can be used to perform the convolution. For example, the convolution can comprise performing a mathematical function (XORing, scaling, shifting, etc.), for example, on the data. The mathematical function can comprise an algorithm that is preprogrammed in a data memory device and the data memory device's controlling device.

Upon receiving the data transfer, the data memory device 300 utilizes to block 338 to perform a codeword calculation for the arriving information (e.g., command, parameter, and/or data) and make a determination based upon the result as to whether any errors were present in the transmission. For example, the component 324 can obtain an appended codeword from the data. Using the EDC checker 338 (initialized using the UID 340), the component 324 determines whether the appropriate unique identifier (i.e., a copy of UID 340) was utilized to generate the codeword and whether the data contains errors. In this manner, commands and data that were incorrectly routed to the data memory device 300 can be promptly detected at the interface 320 of the device 300. For instance, in one example a command and/or data received at data memory device 300 may have been intended for another data memory device (other than data memory device 300) and instead misrouted to data memory device 300. Based on the error determination, the error handling logic 326 can decide to execute the command and/or can return a status to the controlling device, for example.

In accordance with one embodiment, the error detection codeword can be discarded or can be stored along with the data in the memory array 322. Further, read-after-write error checks can be performed using the codewords to detect program and/or read errors.

It is noted that elements described herein can by implemented in hardware, software, firmware, or a combination of the above, for example.

Figure 5:
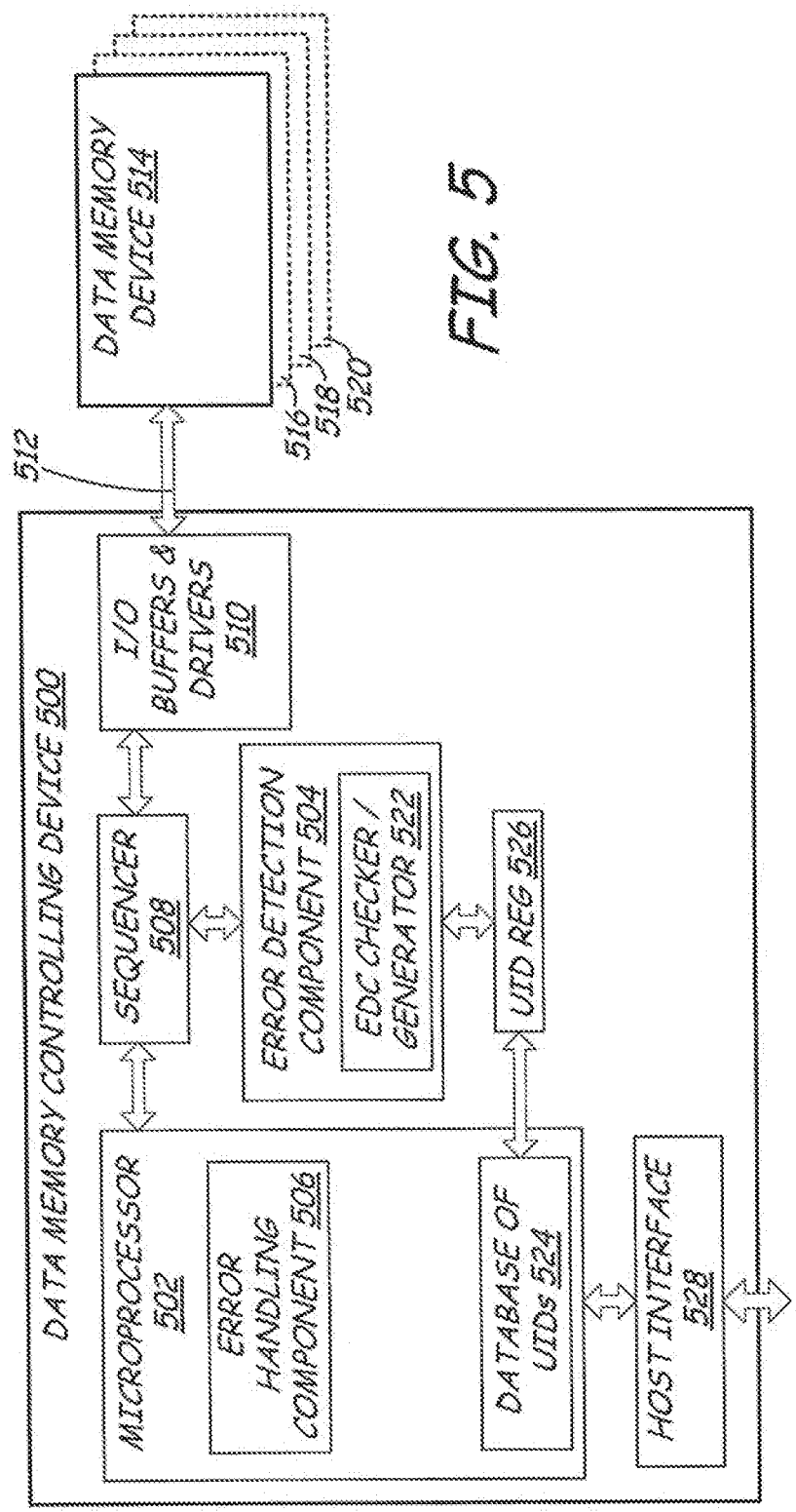
FIG. 5 is a schematic diagram of a controller for a plurality of data memory devices.

FIG. 5 illustrates one embodiment of a data memory controlling device (such as controlling device 310 illustrated in FIG. 3). Controlling device 500 includes a microprocessor 502, an error detection component 504, and an error handling component 506 and a host interface 528. Error handling component 506 includes error handling logic for implementing various processes based on whether errors are detected and/or a number of errors detected by component 504. This can include implementing data retries, error correction, implementing to alerts, to name a few. Data from microprocessor 502 is provided to a sequencer 508 and to input/output buffers and drivers 510. The sequencer 508 illustratively includes a functional block for controlling the transfer of data between the device 500 and the data memory device 514 through data channel 512. The sequencer 508 can include a plurality of registers for reading data from and writing data to the data memory device 514.

In the illustrated embodiment, data memory device 514 is illustratively similar to data memory device 300 illustrated in FIG. 4. Moreover, the controlling device 500 can be coupled to a plurality of data memory devices 514, 516, 518, and 520.

In the illustrated embodiment, the error detection component 504 includes an EDC checker/generator 522 configured to generate error detection codewords. The codewords are appended to data that is transferred to one or more of data memory devices (e.g., devices 514, 516, 518, 520). Further, block 522 is also configured to receive error detection codewords appended to data received by the controlling device 500 and utilize the error detection codewords to detect errors in the data. In one embodiment, block 522 is similar to block 338 illustrated in FIG. 4 and utilizes cyclical redundancy code logic.

In accordance with one embodiment, the controlling device 500 includes a database of unique identifiers (UIDs) 524. The database 524 includes copies of each of the unique identifiers associated with the data memory devices 514-520. For instance, database 524 includes a copy of the unique identifier 340 associated with data memory device 300.

When information (e.g., commands, user data, instructions, parameters) is to be transmitted from controlling device 500 to a particular data memory device (or when information is received from a particular data memory device) microprocessor 502 retrieves a copy of the unique identifier associated with the particular data memory device from database 524. The identifier is provided to a register 526 and to the error detection component 504. The identifier is used to initialize the EDC checker/generator 522. In one example, the error detection codeword generated by component 504 is obtained by convoluting the unique identifier with a cyclic redundancy code (CRC) generated based on data to be transmitted.

Figures 6, 7:
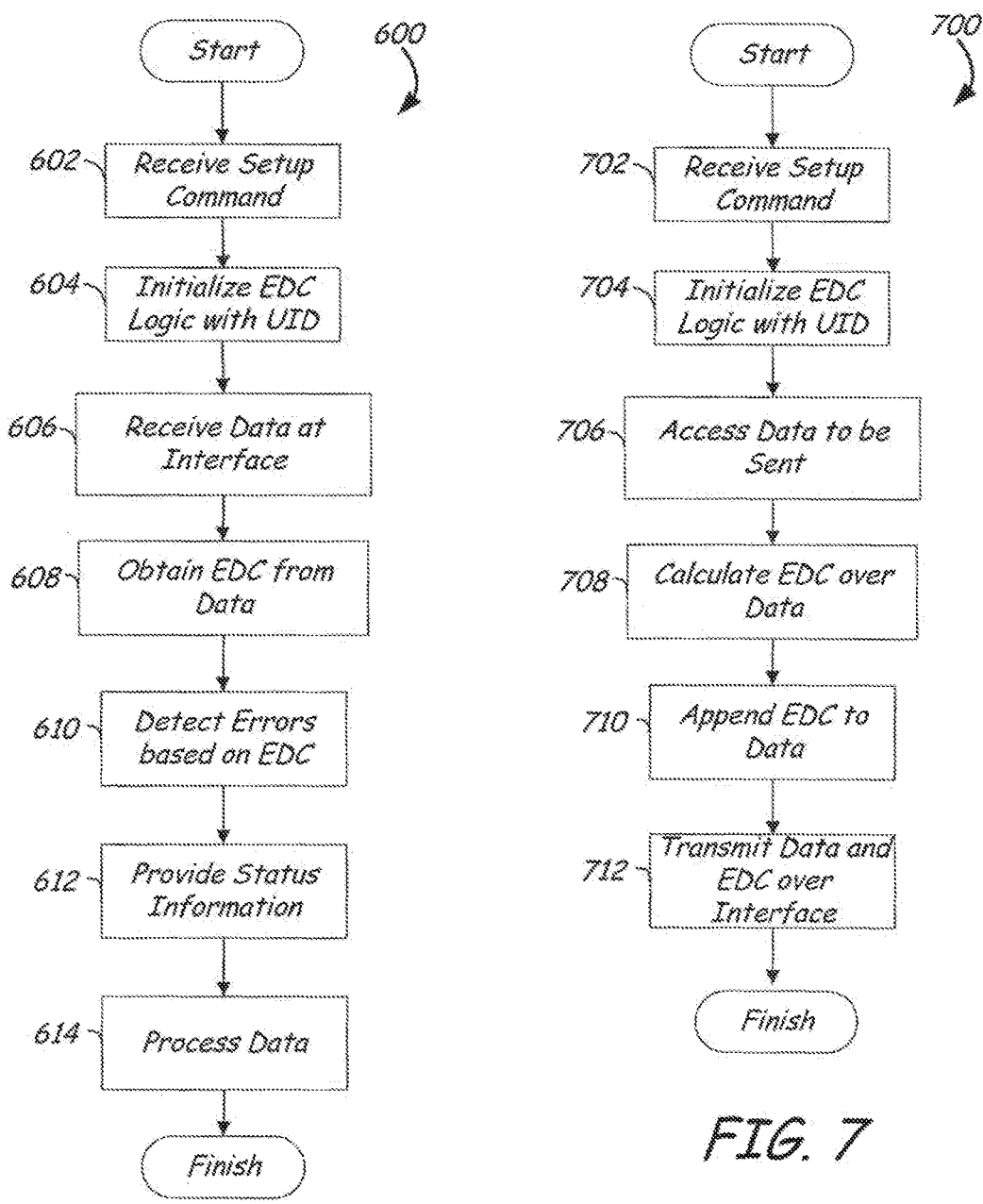
FIG. 6 is a flow diagram of a method of detecting errors in data received at an interface of a data memory device.
FIG. 7 is a flow diagram of a method of generating error detection information for data transmitted at an interface of a data memory device.

FIG. 6 is a flow diagram of a method of detecting errors received at an interface of a data memory device and FIG. 7 is a flow diagram of a method of generating error detection code for data transmitted from an interface of a data memory device. In one embodiment, the methods 600 and 700 are implemented at the interface 320 of data memory device 300 illustrated in FIG. 4. For illustration purposes, methods 600 and 700 are described below in the context of FIG. 4 and is not intended to limit the scope of the concepts described herein.

At step 602, prior to receiving information (e.g., user data, parameters, status information, write commands, read commands, etc.) a setup command is received at the data memory device. Error detection codeword logic (EDC) is initialized at step 604 with a unique identifier associated with the data memory device. For instance, in the context of FIG. 4 the unique identifier 340 is utilized to initialize the EDC checker/generator 338 prior to a transfer of information. It is noted that in some embodiments the EDC logic can be initialized at step 604 without transferring a setup command at step 602.

At step 606, information containing an appended error detection codeword (EDC) is received at the interface of the data memory device 300. In one embodiment, the EDC was previously generated by the controlling device based on a cyclical redundancy code generated as a function of the transmitted information and a copy of the unique identifier that was used to initialize the logic at step 604.

At step 608, the error detection codeword (EDC) is obtain from the information and used by the EDC logic (initialized at 604) to detect errors at step 610. In accordance with one embodiment, step 610 determines if any errors are present in the transmitted data and whether the proper data memory device received the information using the EDC and the unique identifier.

At step 612, status information can be provided based on whether errors have been detected. For example, this can include sending a status indication to the controlling device indicating that the data contains errors.

At step 614, the data is processed accordingly. For example, this can include, but is not limited to, initiating a second data transmission (such as a retry) to the data memory device, performing an error correction process, storing the data in the data memory device, and/or canceling the data operation.

Referring to method 700, a setup command is received at step 702 and EDC logic is initialized at step 704. In one embodiment, steps 702 and 704 are similar to steps 602 and 604 illustrated in FIG. 6. At step 706, data to be sent from the data memory device is accessed, for example from a memory array 322. Using the data and the initialized EDC logic, an error detection codeword is calculated at step 708. For example, step 708 can include generating a cyclical redundancy code based on the data and the unique identifier.

The error detection code is appended to the data at step 710 and the data are transmitted over the interface to the controlling device at step 712.

Figure 8:
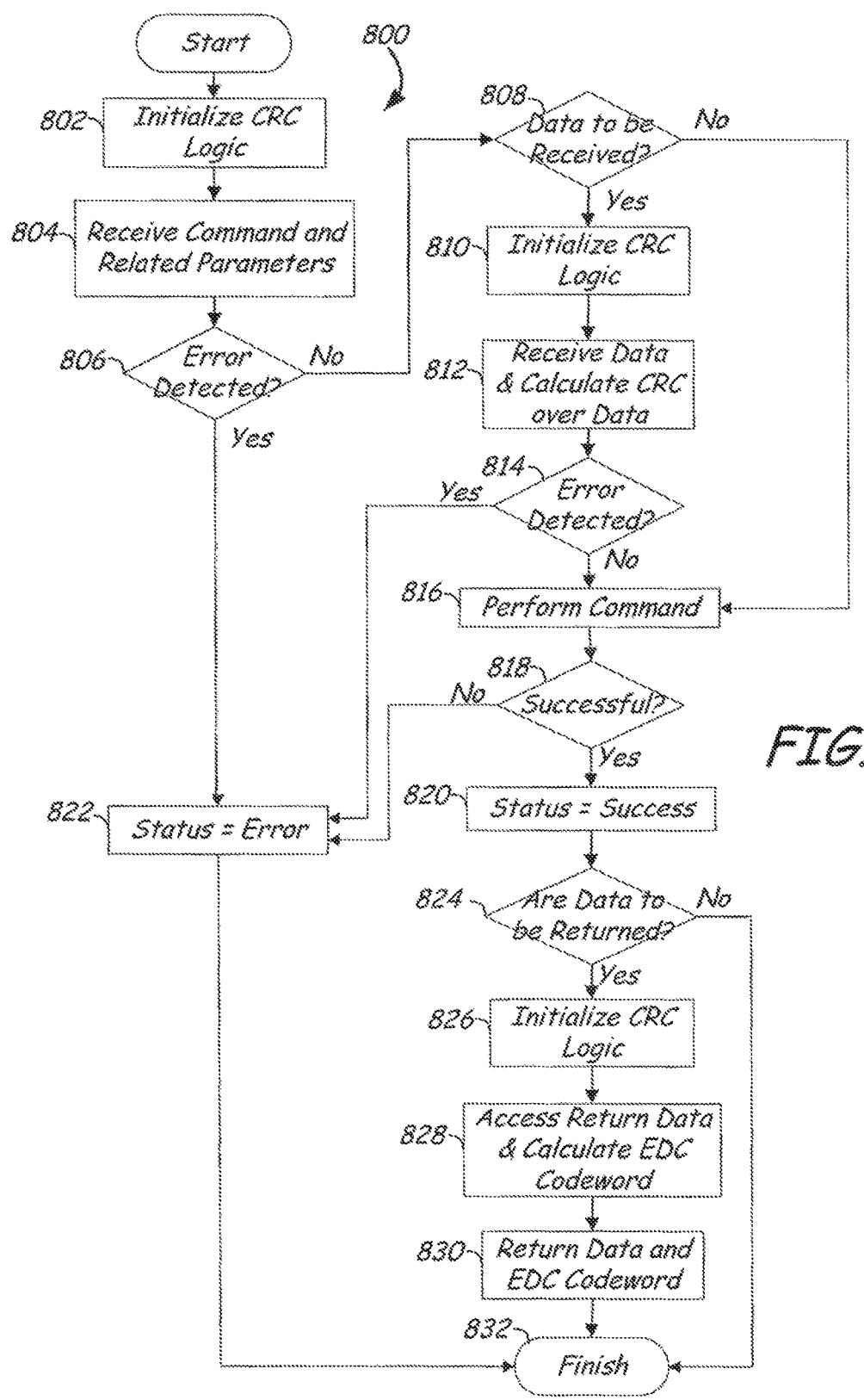
FIG. 8 is a flow diagram of a method for data communication with a data memory device using error detection code.

FIG. 8 illustrates a method 800 for data communication with a data memory device using error detection codewords appended to transmitted data. In the embodiment illustrated in FIG. 8, cyclical redundancy code (CRC) logic is utilized to generate the error detection codewords. However, in other embodiments the error detection codewords can be generated using, for example, check bits, parity bits, check sums, longitudinal redundancy checks, hash functions, polarity schemes, turbo codes, Hamming codes, and Reed-Solomon to error correction codes, to name a few.

At step 802, CRC logic associated with an interface of the data memory device is initialized, for example in response to a setup command from a controlling device. In one embodiment, step 802 includes using a unique identifier associated with the data memory device to initialize the CRC logic.

At step 804, information including commands, parameters, data, status information, address information, and/or combinations thereof, is received from the controlling device at an interface of the data memory device. Step 806 determines whether errors are present in information. The error detection process of step 806 is performed using the CRC logic initialized in step 802.

If errors are detected (or a number of errors above a predefined threshold), the method proceeds to block 822 in which an error status is set and optionally returned to the controlling device. If no errors (or a number of errors below a predefined threshold) are detected at step 806, the method proceeds to block 808 and the method determines whether data are to be received from the controlling device. For example, the information received at step 804 can comprise a write command and the information received at step 808 can comprise the data to be written to the memory device.

If no data are to be received at step 808 (for example, a read command is received), the method proceeds to block 816. If data are to be received from the controlling device, the method proceeds to block 810. Block 810 is an optional step in which the CRC logic can be re-initialized, if desired. At block 812, the data is received and the cyclical redundancy code is calculated based on the data using the CRC logic. If an error is detected at step 814, the method proceeds to block 822. If no errors (or a number of errors below a predefined threshold) are detected, method proceeds to step 816.

At step 816, the command is performed on the data. For example, block 816 comprises storing data to storage locations in the data memory device. In another example, block 816 comprises reading data from storage locations in the data memory device.

At step 818, if the command is not successfully performed the method proceeds to block 822. If the command is successfully performed, the method proceeds to block 820 in which a status is set to indicate that the command was successful.

At step 824, the method determines whether data are to be returned to the controlling device from the data memory device. If no data are to be returned, the method ends at block 832. If data are to be returned, the method proceeds to block 826. Block 826 is an optional step in which the CRC logic can be re-initialized, if desired. At block 828, the data to be returned to the controlling device are accessed and an error detection codeword is calculated based on the data using the CRC logic. The codeword is appended to the data and returned to the controlling device at step 830.

Figure 9:
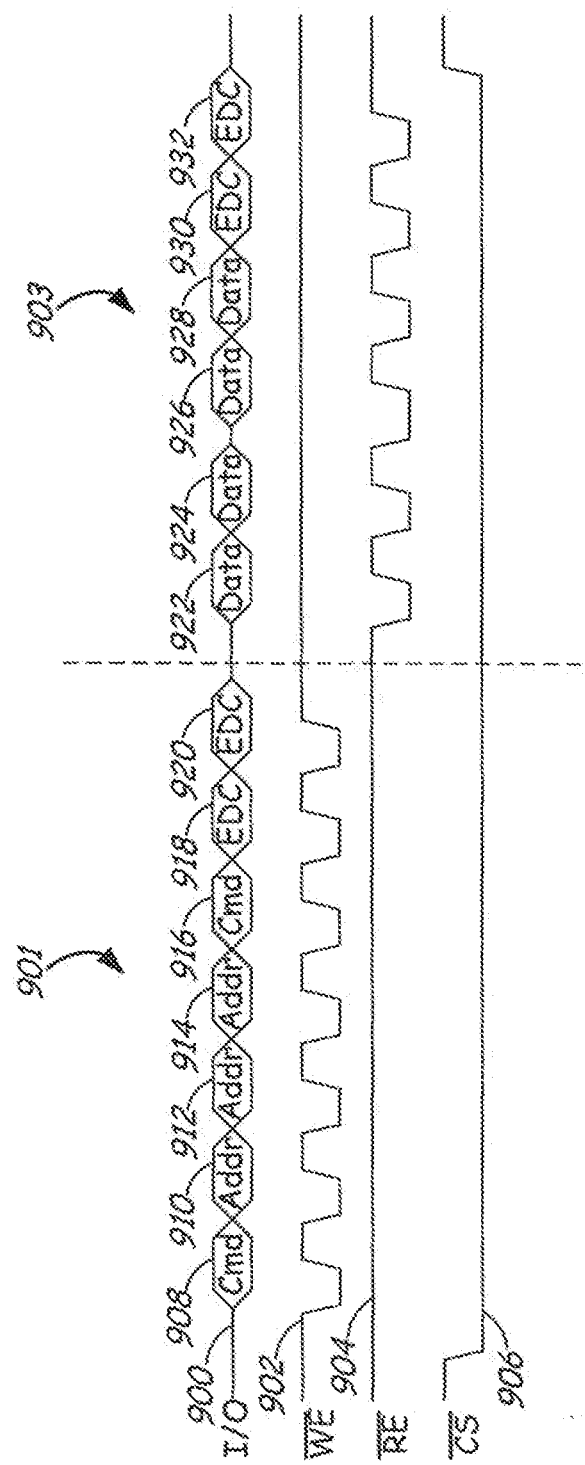
FIG. 9 is a timing diagram of a system for transmitting data using error detection code.

FIG. 9 illustrates a timing diagram of a system for transmitting data using error detection codes. FIG. 9 illustrates an input/output channel 900, a write enable bit 902, a read enable bit 904, and a chip select bit 906. The timing diagram of FIG. 9 illustrates an exemplary read command provided from a controlling device to a data memory device to cause the data memory device to return requested data to the controlling device. A first portion 901 illustrates a command portion of the data transmission. In the first portion 901, the write enable bit 902 is toggled between a high state and a low state which causes the data memory device to receive or read in the associated command and address information 908-916. Appended to the command and address information is error detection codeword data 918 and 920 which can include, for example, cyclical redundancy code information generated by the controlling device.

A second portion 903 of the diagram of FIG. 9 represents a subsequent data return of information to the controlling device. In the second portion 903, the read enable bit 904 is toggled between a high state and a low state to cause the data memory device to output or read out data to the controlling device. Error detection codeword information 930 and 932 is appended to the user data 922-928 that is returned to the controlling device. In one embodiment, the error detection codeword information 930 and 932 is generated using cyclical redundancy code logic and can be similar to the logic utilized to check the error detection code 918 and 920 received with the command information.

It is to be understood that even though numerous characteristics and advantages of various embodiments of the invention have been set forth in the foregoing description, together with details of the structure and function of various embodiments of the disclosure, this disclosure is illustrative only, and changes may be made in detail, especially in matters of structure and arrangement of parts within the principles of the present disclosure to the full extent indicated by the broad general meaning of the terms in which the appended claims are expressed. For example, the particular elements may vary depending on the particular application for the system or method while maintaining substantially the same functionality without departing from the scope and spirit of the present disclosure and/or the appended claims.

What is claimed is:

1. A controller in a data storage system, the controller comprising:
   at least one interface for communicating data with a plurality of data memory devices;
   a database containing a plurality of identifiers, wherein at least one identifier is associated with and uniquely identifies each of the plurality of data memory devices; and
   a component configured to generate, for a transmission of data between the controller and a selected data memory device, an error control code based on the data and the at least one identifier associated with the selected data memory device.

2. The controller of claim 1, wherein the plurality of data memory devices comprise a plurality of solid-state memory devices configured to communicate with the controller, each of the plurality of solid-state memory devices being uniquely identified by an identifier stored in the database.

3. The controller of claim 1, wherein the error control code comprises one or more of an error detection code and an error correction code.

4. The controller of claim 1, wherein the component is initialized with the at least one identifier prior to generating the error control code based on the data to be transmitted to the selected data memory device.

5. The controller of claim 1, wherein the component generates the error control code by convoluting the at least one identifier associated with the selected data memory device with a cyclical redundancy code generated based on the data to be transmitted to the selected data memory device.

6. The controller of claim 1, wherein the component comprises error detection logic that is initialized using the at least one identifier associated with the selected data memory device to detect errors in data received from the selected data memory device.

7. The controller of claim 6, wherein the error detection logic receives a codeword appended to the data received from the selected data memory device, the codeword having been generated by the selected data memory device as a function of the at least one identifier associated with the selected data memory device.

8. The controller of claim 7, wherein the error detection logic calculates a second codeword based on the data received from the selected data memory device and compares the second codeword to the codeword appended to the data to identify a number of errors in the data.

9. The controller of claim 1 further configured to:
   perform storage operations to the plurality of data memory devices based on commands received via a host interface configured to communicate with an external host device, the storage operations including:
     provide data to be stored to the selected data memory device along a write path between the at least one interface and a memory element of the selected data memory device;
   wherein the controller is configured to communicate with the plurality of data memory devices that each include:
     the memory element for storing data; and
     an error detection component configured to detect errors on data transmitted between the controller and the selected data memory device based on the error control code, the error detection component provided in the write path and configured to determine a number of errors in the data prior to the data being stored to the memory element of the selected data memory device.

10. The controller of claim 9, wherein the plurality of data memory devices comprise a plurality of solid-state memory devices configured to communicate with the controller, each of the plurality of solid-state memory devices storing the at least one identifier associated with an uniquely identifying the solid-state memory device, and wherein each of the plurality of data memory devices comprises an error detection component configured to utilize the at least one identifier of the data memory device to generate an error detection codeword for data transmitted between the data memory device and the controller.

11. The controller of claim 1 further configured to:
   receive a data access request from a host device via a host interface;
   determine, based on the data access request, data to transmit from the controller to the selected data memory;
   generate the error control code via the component;
   transmit the data and the error control code to the selected data memory device; and
   wherein the selected data memory device is configured to check the data for errors based on the error control code prior to storing the data to the data memory device.

12. A method comprising:
  communicating data from a controller of a data storage device to a plurality of data memory devices via at least one interface of the controller;
  maintaining, via a controller of the data storage device, a database containing a plurality of unique identifiers associated with and uniquely identifying the plurality of data memory devices of the data storage device; and
  generating, at a component of the controller for transmission to the data memory device, an error control code based on data for transmitting to the data memory device and the unique identifier associated with the data memory device.

13. The method of claim 12, further comprising initializing the component with the unique identifier prior to generating the error control code based on the data to be transmitted to the data memory device.

14. The method of claim 12, further comprising generating, via the component, the error control code by convoluting the at least one identifier associated with the data memory device with a cyclical redundancy code generated based on the data to be transmitted to the data memory device.

15. The method of claim 12, further comprising detecting, via the component, errors in data received from the data memory device using the unique identifier associated with the data memory device.

16. The method of claim 15, further comprising detecting errors at the component includes receiving a codeword appended to the data received from the data memory device, the codeword having been generated by the data memory device as a function of the unique dentifier associated with the data memory device.

17. The method of claim 16, further comprising calculating, at the component, a second codeword based on the data received from the data memory device and comparing the second codeword to the codeword appended to the data to identify a number of errors in the data.

18. The method of claim 12 further comprising:
  receiving a data access request at a data storage device from a host device via a host interface;
  determining, based on the data access request, data to transmit from the controller to a data memory device from the plurality of memory devices;
  transmitting the data and the error control code to the data memory device; and
  checking, at the data memory device, the data for errors based on the error control code prior to storing the data to the data memory device.

19. A memory device storing instructions that, when executed, cause a processor to perform a method including:
  communicating data from a controller of a data storage device to a plurality of data memory devices via at least one interface of the controller;
  maintaining, via a controller of the data storage device, a database containing a plurality of unique identifiers associated with and uniquely identifying the plurality of data memory devices of the data storage device; and
  generating, at a component of the controller for transmission to the data memory device, an error control code based on data for transmitting to the data memory device and the unique identifier associated with the data memory device.

20. The memory device of claim 19, the method further comprising initializing the component with the unique identifier prior to generating the error control code based on the data to be transmitted to the data memory device.

21. The memory device of claim 19, the method further comprising generating, via the component, the error control code by convoluting the at least one identifier associated with the data memory device with a cyclical redundancy code generated based on the data to be transmitted to the data memory device.

22. The memory device of claim 19, the method further comprising detecting, via the component, errors in data received from the data memory device using the unique identifier associated with the data memory device.

23. The memory device of claim 22, the method further comprising detecting errors at the component includes receiving a codeword appended to the data received from the data memory device, the codeword having been generated by the data memory device as a function of the unique dentifier associated with the data memory device.

24. The memory device of claim 23, the method further comprising calculating, at the component, a second codeword based on the data received from the data memory device and comparing the second codeword to the codeword appended to the data to identify a number of errors in the data.

25. The memory device of claim 19, the method further comprising:
  receiving a data access request at a data storage device from a host device via a host interface;
  determining, based on the data access request, data to transmit from the controller to a data memory device from the plurality of memory devices;
  transmitting the data and the error control code to the data memory device; and
  checking, at the data memory device, the data for errors based on the error control code prior to storing the data to the data memory device.

* * * * *